United States Patent [19]
Sung

[11] Patent Number: 5,918,124
[45] Date of Patent: Jun. 29, 1999

[54] FABRICATION PROCESS FOR A NOVEL MULTI-STORAGE EEPROM CELL

[75] Inventor: James Sung, Yang-Mei, Taiwan

[73] Assignee: Vanguard International Semiconductor Corporation, Hsin-Chu, Taiwan

[21] Appl. No.: 08/944,501

[22] Filed: Oct. 6, 1997

[51] Int. Cl.[6] .............................................. H01L 21/8247
[52] U.S. Cl. ......................... 438/258; 438/267; 438/596
[58] Field of Search .................................... 438/258, 264, 438/266, 267, 593, 594, 596

[56] References Cited

U.S. PATENT DOCUMENTS

| | | | |
|---|---|---|---|
| 5,021,999 | 6/1991 | Kohda et al. | 365/168 |
| 5,354,702 | 10/1994 | Arima et al. | 438/594 |
| 5,494,838 | 2/1996 | Chang et al. | 438/267 |
| 5,529,945 | 6/1996 | Rao | 437/52 |
| 5,614,747 | 3/1997 | Ahn et al. | 438/267 |

*Primary Examiner*—Chandra Chaudhari
*Attorney, Agent, or Firm*—George O. Saile; Stephen B. Ackerman

[57] ABSTRACT

A EEPROM cell design, and a method of fabrication for the EEPROM cell, has been developed. The EEPROM cell includes a polysilicon control gate structure, polysilicon select gate structures, and novel polysilicon, floating gate spacer structures, fabricated using deposition and anisotropic etching, sidewall processes. The use of floating gate spacers, allows density improvements to be realized. The EEPROM cell can programmed, read, and erased, using only biasing conditions, without having to use UV light for the erase cycle.

26 Claims, 5 Drawing Sheets

FABRICATION PROCESS FOR A NOVEL MULTI-STORAGE EEPROM CELL

BACKGROUND OF THE INVENTION (1) Field of the Invention

This invention relates to a method of fabricating a non-volatile semiconductor memory cell, and more specifically to a memory cell comprised of an arrangement of a control gate and floating gates, allowing multiple data storage, on the same cell, to be realized.

(2) Description of the Prior Art

Numerous applications for non-volatile memory devices have been used in advanced semiconductor products. One type of non-volatile memory device, widely used in the semiconductor industry has been the erasable electrically programmable read only memory, (EEPROM), device. The most commonly used EEPROM is comprised of a double-gate cell, in which a floating gate, usually comprised of polysilicon, overlays a thin insulator layer, and also directly underlies a control gate, again usually comprised of polysilicon. Another insulator layer separates the control gate from the underlying floating gate. This type of configuration results in only single bit, or two levels of data storage. Attempts at fabricating non-volatile memory devices, possessing logic multiple storage functions have two approaches. One approach uses a multiple level storage scheme in which instead of only one threshold to define the store, high or low, multiple threshold voltages of the memory cell can be used, allowing the storage of multiple bits (01, 10, 11), in the same cell. However due to the constraint of the supply voltage, the multiple threshold voltage scheme operates with a reduced noise margin. This is not practical for low power, (low voltage), EEPROM devices. Another approach is to store more than one bit of information in the same cell, the multiple storage data scheme, however still maintaining one threshold voltage, for a the desired large noise margin. For example Kohda, et al, in U.S. Pat. No. 5,021,999, have described an EEPROM cell in which two bit data storage, on a single cell, is available. This is accomplished by using two floating gate shapes, lying on a thin insulator layer, and with a control gate shape, overlying the two floating gates shapes, separated from the floating gate shapes by another insulator layer. Although this non-volatile structure increases storage density, levels, several aspects of the structure remained non-optimized. For example in the Kohda, et al, invention, although the program, or write cycle, is achieved by properly biasing the control gate and drain region, ultimately resulting in electrons being injected into the floating gate, the erase cycle has to be performed using UV light. Under UV light the electrons trapped in the floating gate are dissipated into the substrate. In addition in the Kohda, et al, invention, the floating gate shapes have significant lateral dimensions, reducing the efficiency of the multiple storage schemes contribution to cell density.

This invention will describe the fabrication of an EEPROM cell, offering multiple storage capability. However unlike Kohda, et al, this invention will use Fowler-Nordheim injection, achieved using specific biasing configurations, to achieve the erase function of the device, thus avoiding the need for UV processing. In addition the floating gate structures will be obtained from creating spacer shapes, on the sidewalls of an insulator coated, control gate structure, thus more efficiently, reducing the cell area.

SUMMARY OF THE INVENTION

It is an object of this invention to create an EEPROM cell offering multiple storage levels.

It is another object of this invention to fabricate an EEPROM cell using floating gate spacer structures, to minimize the area needed for the EEPROM cell.

It is still another object of this invention to operate the EEPROM cell using specific biasing conditions for the floating gates, select gates, control gates, and drain regions, thus avoiding the need for UV exposures, for the erase cycle.

In accordance with the present invention a process for creating an EEPROM cell, offering multiple data storage, on the same cell, and floating gate spacer structures, for density improvements, is described. A P well region is formed in a semiconductor substrate, followed by the growth of a gate oxide layer, a first polysilicon layer, and an overlying capping insulator layer. Patterning is used to create the control gate structure, comprised of the capping insulator layer, the first polysilicon layer, and the gate oxide layer. The patterning procedure also creates the initial select gate structures, again comprised of the capping insulator layer, the first polysilicon layer, and the gate oxide layer. A silicon oxide spacer is next formed on the exposed sides of the control gate, and the initial select gate structures. A thin tunnel insulator layer is grown on the surface of the semiconductor substrate, exposed between the control gate, and the initial select gate structures. A second polysilicon layer is deposited, and subjected to anisotropic dry etching procedures, to create floating gate spacer structures on the exposed sides of the silicon oxide spacers, located on the sides of the control gate, and on the sides of the initial select gate structures, with the floating gate spacer structures overlying the thin tunnel insulator layer. The floating gate spacer structures are then removed from the sides of the initial select gate structures, resulting in floating gate spacer structures, only on the sides of the silicon oxide spacers, on the control gate structure. Patterning is next performed to create the final select gate structure, followed by removal of the thin tunnel insulator layer, in regions in which the thin tunnel insulator layer is not covered by the floating gate spacer structures. The exposed silicon oxide spacers, on the sides of the final select gate structures, are also removed. An insulator layer is next deposited and subjected to an anisotropic dry etch procedure to create insulator gate spacers on the sides of the floating gate spacer structure, and on the sides of the final select gate structures. Finally heavily doped N type source and drain regions are created in the semiconductor substrate, in regions not covered by the control gate, the floating gate spacer, or the final select gate structures.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
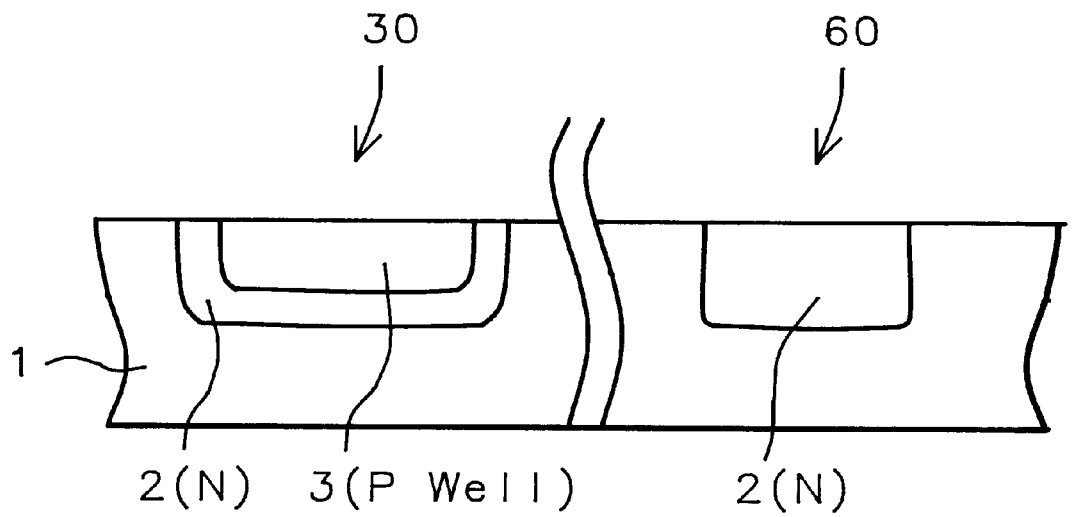
FIGS. 1–9, which schematically, in cross-sectional style, show the fabrication stages used to create an EEPROM cell, comprised of floating gate spacer structures.

The method of creating an EEPROM cell, featuring floating gate spacer structures, and offering multiple bit storage, will now be described in detail. FIG. 1, schematically shows the early stages of fabrication for EEPROM cell region 30, as well as for peripheral, or non-cell region 60. A P type semiconductor substrate 1, comprised of single crystalline silicon, with a <100> crystallographic orientation, is used. A N type region 2, is formed in substrate 1, for both the EEPROM cell region 30, and for periphery region 60. N type region 30, is formed via ion implantation of arsenic or phosphorous, at an energy between about 1 to 2 MeV, at a dose between about 1E12 to 1E13 atoms/cm$^2$. Subsequent heat treatments distribute the N type dopants, forming N type region 2. Photolithographic procedures are next used to allow a P type, ion implantation procedure, to be performed in a desired region of EEPROM cell 30, and with subsequent heat treatment, providing P well region 3, schematically shown in FIG. 1. Either $B^{11}$, or $BF_2$ is implanted, at an energy between about 100 to 500 KeV, at a dose between about 1E12 to 1E13 atoms/cm$^2$, to create P well region 3. The remainder of the description of this invention will now only address only the EEPROM cell 30.

Figure 2:
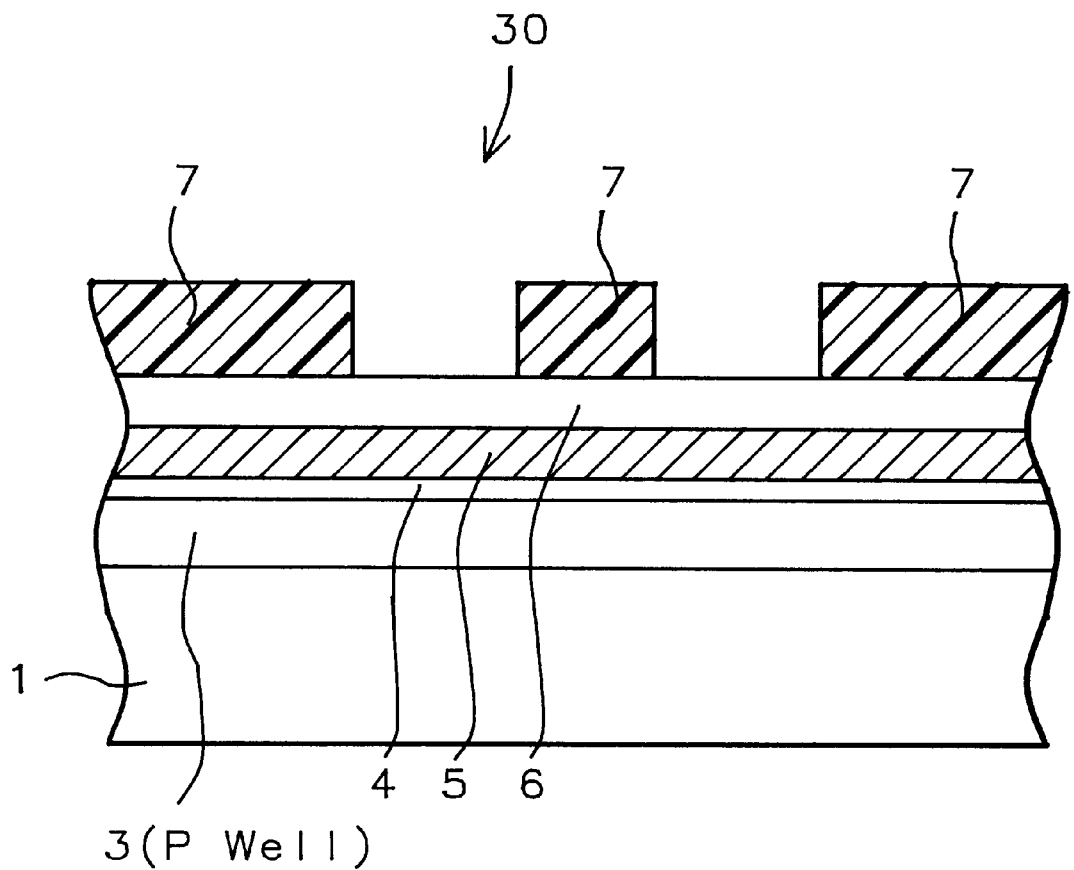

A gate oxide layer 4, comprised of silicon dioxide, thermally grown in an oxygen-steam ambient, at a temperature between about 850 to 900° C., to a thickness between about 120 to 200 Angstroms, is shown schematically in FIG. 2. A first polysilicon layer 5, is next deposited using low pressure chemical vapor deposition, (LPCVD), procedures, at a temperature between about 520 to 580° C., to a thickness between about 1000 to 2000 Angstroms. First polysilicon layer 5, can be obtained using an in situ doping, deposition procedure, where either phosphine, or arsine, is added to a silane ambient. The doping of first polysilicon layer 5, can also be accomplished by ion implantation of either arsenic or phosphorous, into an intrinsically grown first polysilicon layer 4. A capping insulator layer 6, is next deposited, on underlying first polysilicon layer 5, using either LPCVD or plasma enhanced chemical vapor deposition, (PECVD), procedures, at a temperature between about 300 to 700° C., to a thickness between about 300 to 600 Angstroms. Capping insulator layer 6, can either be a silicon oxide layer, a silicon nitride layer, or a composite layer comprised of overlying silicon nitride on underlying silicon oxide, at a thickness between about 1500 to 2500 Angstroms. Photoresist shapes 7, shown schematically in FIG. 2, are formed on the surface of EEPROM cell 30, defining subsequent gate structures.

Figure 3:
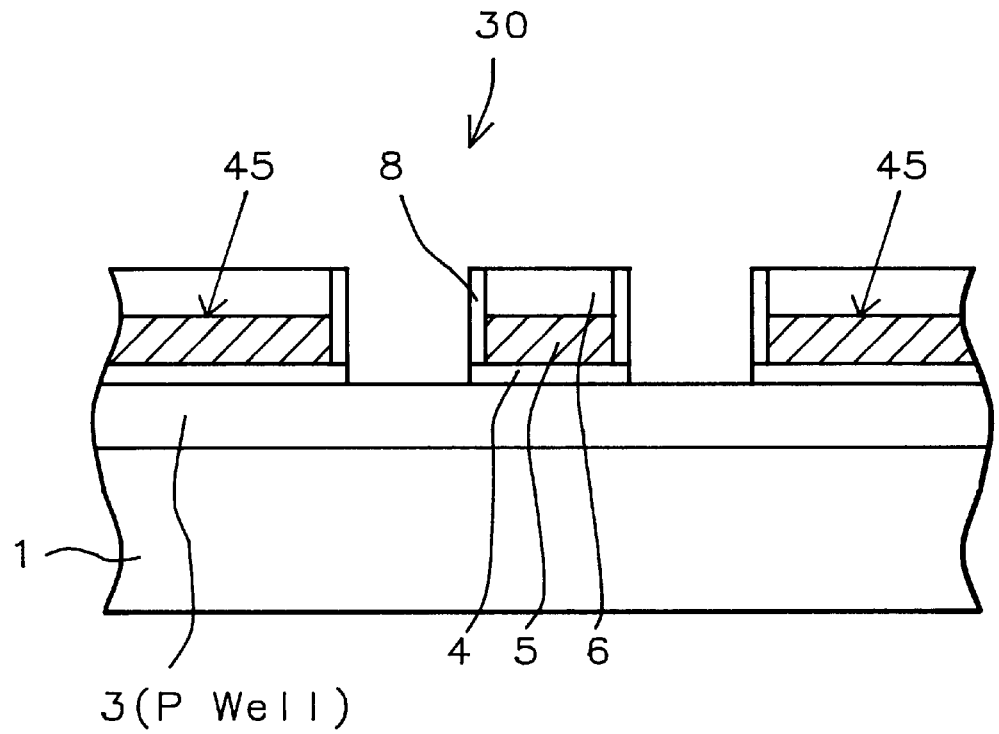
Figure 4:
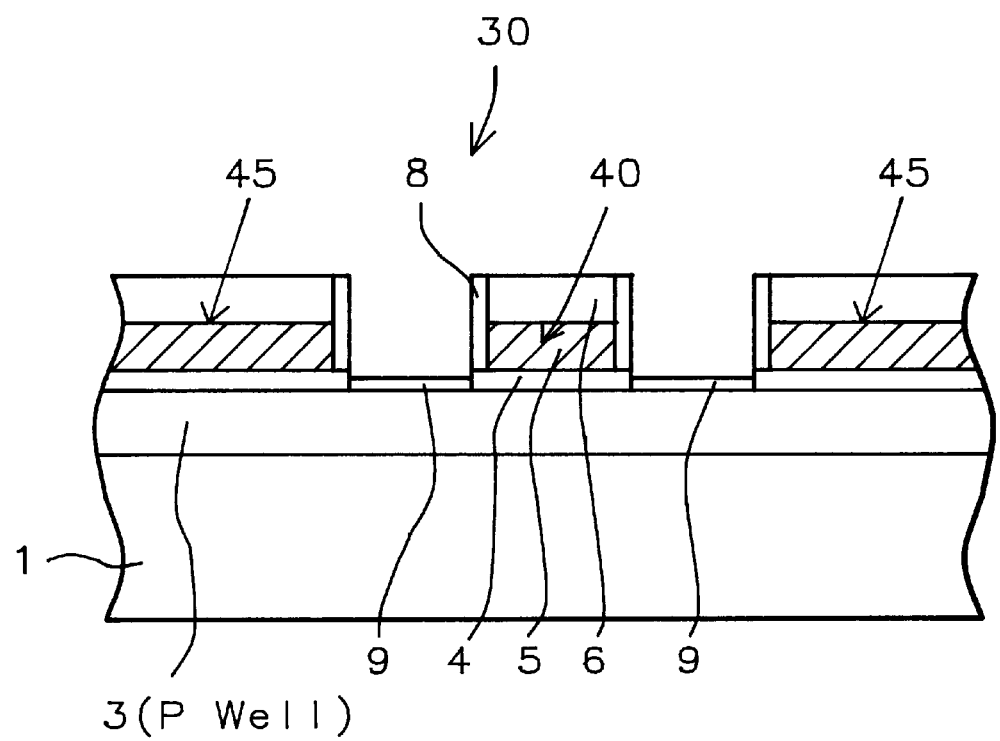

An anisotropic reactive ion etch, (RIE), procedure is next employed, using photoresist shapes 7, as a mask, to define control gate structure 40, as well as initial select gate structures 45, shown schematically in FIG. 3. The RIE procedure is performed using $C_4F_8$ as an etchant for capping insulator layer 6, $Cl_2$ as an etchant for first polysilicon layer 5, stopping on gate oxide layer 4. After removal of photoresist shapes 7, using plasma oxygen ashing and careful wet cleans, a silicon oxide layer is deposited, using LPCVD or PECVD procedures, at a temperature between about 300 to 700° C., to a thickness between about 300 to 600 Angstroms. An anisotropic RIE procedure, using $CHF_3$ as an etchant, is then used to create silicon oxide spacers 8, on the sides of control gate structure 40, as well as on the sides of initial select gate structures 45. Exposed regions of gate oxide layer 4, are removed during this procedure. This is shown schematically in FIG. 3. A thin tunnel insulator layer 9, is next grown on the surface of P well region 3, exposed between the gate structures. Thin tunnel insulator layer 9, schematically shown in FIG. 4, is a silicon dioxide layer, thermally grown in an oxygen-steam ambient, at a temperature between about 850 to 900° C., to a thickness between about 60 to 70 Angstroms.

Figure 5:
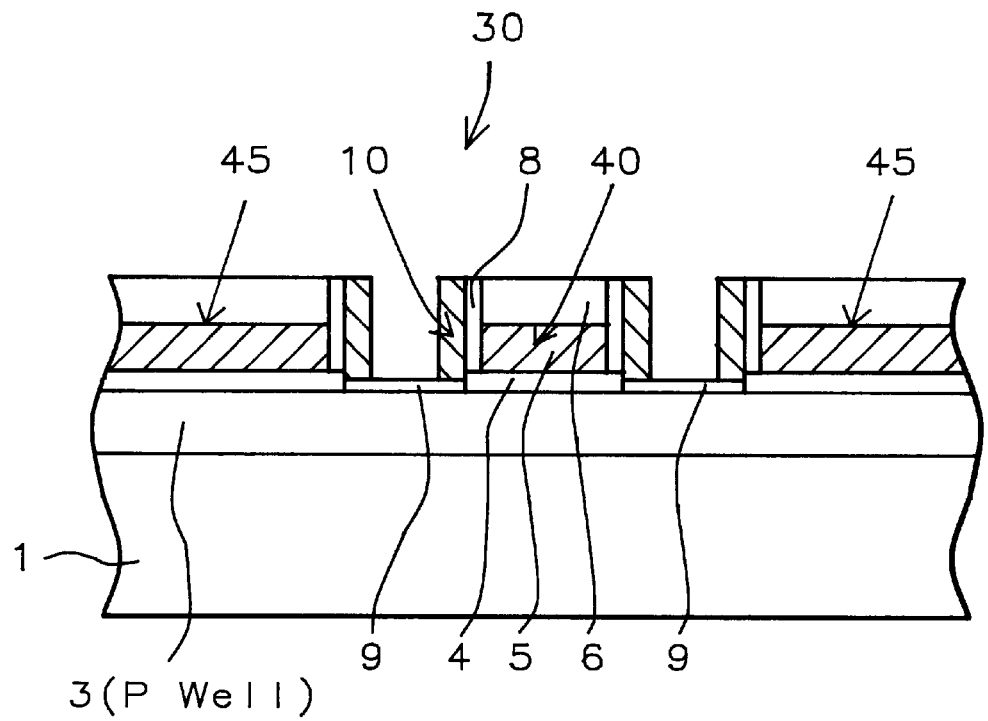
Figure 6:
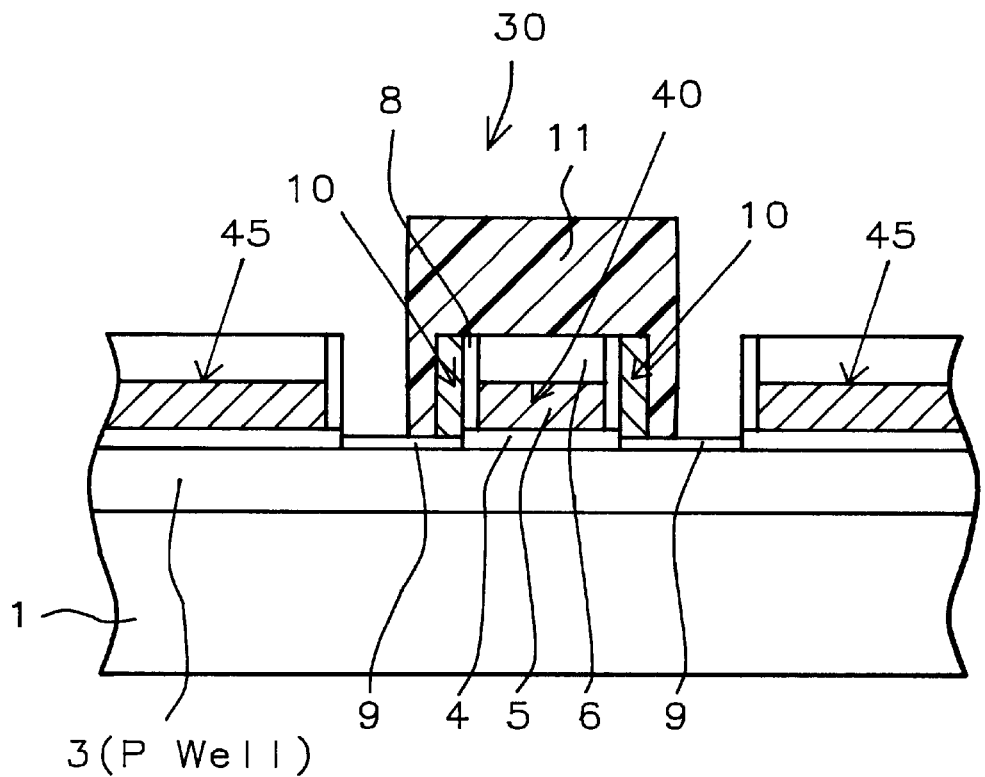

A second polysilicon layer is next deposited using LPCVD, incorporating an in situ doping procedure, at a temperature between about 520 to 580° C., to a thickness between about 500 to 1000 Angstroms. An anisotropic RIE procedure, using $Cl_2$ as an etchant, is used to etch the second polysilicon layer, creating floating gate spacer structures 10, schematically shown in FIG. 5. Floating gate spacer structures 10, on the sides of control gate structure 40, and on the sides of initial select gate structures 45, cover underlying thin tunnel insulator layer 9. A photoresist shape 11, is next used as a mask to allow the removal of the floating gate spacer structures, from the sides of only the exposed initial select gate structures 45, still leaving floating gate spacer structures 10, overlying thin tunnel insulator layer 9, on the sides of silicon oxide spacers 8, of the control gate structure 40. The floating gate spacer structures are removed via RIE procedures, using $SF_6$ as an etchant. Photoresist shape 11, is again removed using plasma oxygen ashing and careful wet cleans. The result of these procedures is schematically shown in FIG. 6.

Figure 7:
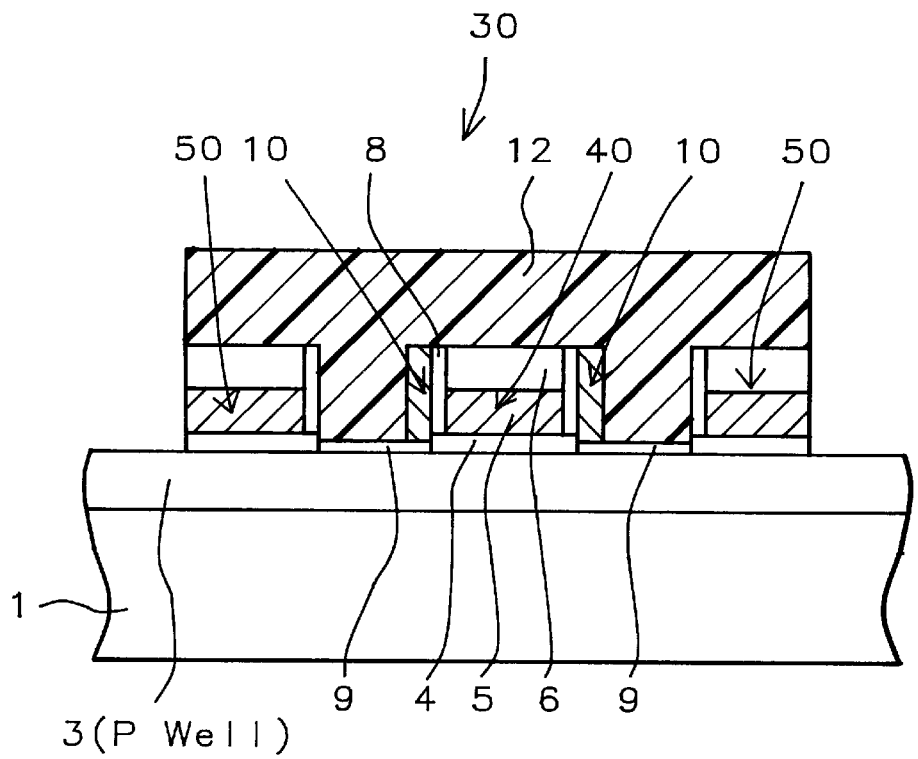
Figure 8:
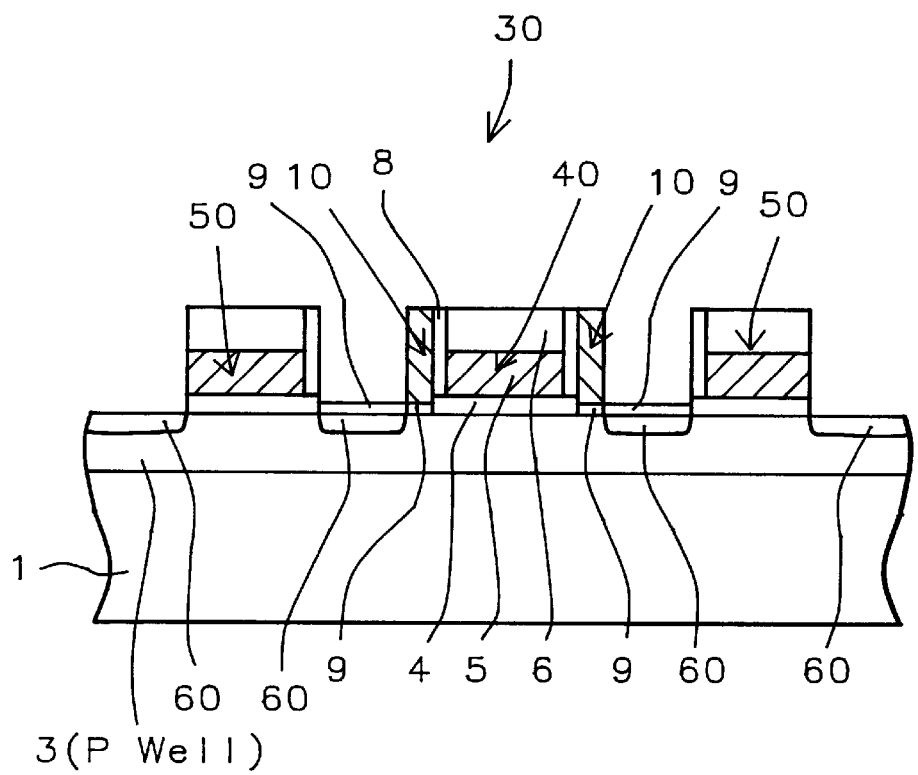

FIG. 7, schematically shows the formation of the final select gate structures 50. A photoresist shape 12, is used as a mask to allow an anisotropic RIE procedure, using $C_4F_8$ as an etchant for capping insulator layer 6, $Cl_2$ as an etchant for first polysilicon layer 5, and $CHF_3$ as an etchant for gate oxide layer 4, creating the final select gate structures so. Removal of photoresist shape 12, is once again accomplished using plasma oxygen ashing and careful wet cleans. A lightly doped, N type source and drain region, 60, is formed via ion implantation of arsenic or phosphorous. This is shown in FIG. 8.

Figure 9:
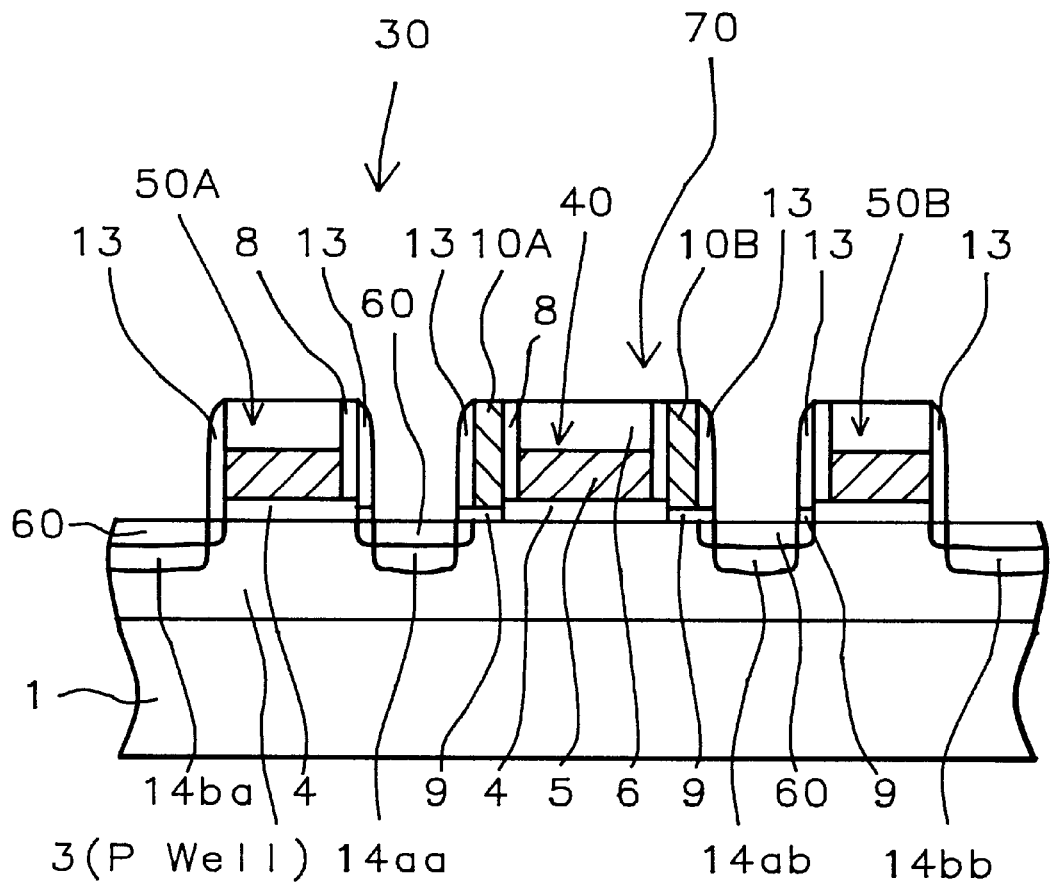

Another insulator layer, of silicon oxide, is next deposited using either LPCVD or PECVD procedures, at a temperature between about 300 to 700° C., to a thickness between about 500 to 1500 Angstroms. An anisotropic RIE procedure, using $CHF_3$ as an etchant, is then used to create insulator gate spacers 13, on the sides of the floating gate structures 10, as well as on the sides of the final select gate structures 50. This is schematically shown in FIG. 9. An ion implantation procedure, using arsenic or phosphorous as implanted species, is performed at an energy between about 30 to 100 KeV, at a dose between about 1E15 to 1E16 atoms/cm$^2$, creating N+ source and drain node regions 14a, between final select gate structures 50, and floating gate spacer structures 10, while creating N+ bit line regions 14b, in other regions. This is schematically shown in FIG. 9.

The EEPROM cell shown schematically in FIG. 9, allows two bit information, retaining the conventional logic level "1" and "0", to be stored in the same memory cell 70. The programming, read and erase operations are explained as follows. (The memory cell, comprised of control gate 40, and floating gate spacers 10, will be designated as memory cell 70. Floating gate spacers 10, will be called 10a and 10b, on each side of the memory cell 70. Select gate structures 50, will be called 50a and 50 b, while source and drain regions 14, will be designated 14ba and 14bb, when placed outside the select gate structures, and 14aa and 14ab, when place between select gate structure and memory cell 70).

In FIG. 9, two different bit lines, through separate source and drain regions 14ba, and 14bb, are linked to the same memory cell 70. The programming, or writing, reading, erasing, sharing the same memory cell 70, is explained as follows.

In the case of programming one bit line through source and drain 14ba, "1", into memory cell 70, electrons are ejected out of the floating gate spacer 10a, into source and drain 14aa, resulting in a net positive charge in floating gate spacer 10a. The effect of the net positive charge is sufficient to invert the silicon surface below, to N type. In the case of "0", no electrons will be ejected out of floating gate spacer 10a. The net charge of floating gate spacer 10a, after programming 14ba "0", is neutral and can not invert the underlying silicon surface. The biasing condition is achieved by biasing the control gate 40, with a high negative voltage.

Reading of the information stored in floating gate spacer 10a, is accomplished by positively biasing control gate 40, select gates 54a and 54b, source and drain 14bb, and grounding source and drain 14ba. The silicon surface below floating gate spacer 10b is depleted due to the reverse bias of source and drain 14ab, and thus becomes the drain node of a NMOSFET device. The silicon surface under floating gate spacer 10a, however is normally P type unless floating gate spacer 10a was programmed "1". The bit information of "1" or "0" stored in floating gate spacer 10a, is distinguished by sensing "yes" or "no" current flow into source and drain 14ba. Reading information stored in floating gate 10b can be done similarly by simply reversing the biasing condition of source and drain 14 ba and 14bb.

Erasing of the entire memory is accomplished by positively biasing the control gate, and negatively biasing the P type substrate, and source and drain regions 14ba and 14bb. The electrons will be injected into the floating gates to nullify the stored positive charge in the floating gates, and reset the stored charge to nearly zero.

The illustrated structure, such as the floating gate spacers, allow storage capacity to be doubled.

While this invention has been particularly shown and described with reference to the preferred embodiments thereof, it will be understood by those skilled in the art that various changes in form and details may be made without departing from the spirit and scope of this invention.

What is claimed is:

1. A method for fabricating a non-volatile memory cell, on a semiconductor substrate, comprising the steps of:

forming a P type region in said semiconductor substrate;

growing a gate oxide layer on said semiconductor substrate;

creating a control gate structure, on said gate oxide layer, consisting of a capping insulator layer overlying a first polysilicon layer;

creating initial select gate structures, on said gate oxide layer, consisting of a capping insulator layer overlying a first polysilicon layer;

forming silicon oxide spacers on the sidewalls of said control gate structure, and on the sidewalls of said initial select gate structures;

growing a thin tunnel insulator layer on regions of said semiconductor substrate, not covered by said control gate structure, and not covered by said initial select gate structures;

forming floating gate spacer structures, on said silicon oxide spacers, and overlying said thin tunnel insulator layer, wherein said floating gate spacer structures are comprised of a second polysilicon layer;

removing unwanted floating gate spacer structures from said silicon oxide spacer, only in a region in which floating gate spacer structures, on said silicon oxide spacer, reside on the sidewalls of said initial select gate structures, while leaving said floating gate structures, on said silicon oxide spacers, in a region in which floating gate structures, on said silicon oxide spacer, reside on the sidewalls of said control gate structure;

patterning of said initial select gate structures, to form final select gate structures;

removing said thin tunnel insulator layer from said semiconductor substrate, in a region of said semiconductor substrate, not covered by said floating gate spacer structures, not covered by control gate structure, and not covered by said final select gate structure, while also removing said silicon oxide spacers from the sidewalls of said final select gate structures;

forming insulator gate spacers, on the sidewalls of said floating gate spacer structures, and on the sidewalls of said final select gate structures;

forming source and drain node regions, in said semiconductor substrate, in regions between said floating gate spacer structures, and said final select gate structures; and forming bit line regions, in said semiconductor substrate, in regions butting the outside shape of the final select gate structure.

2. The method of claim 1, wherein said gate oxide layer is a silicon dioxide layer, thermally grown in an oxygen-steam ambient, at a temperature between about 850 to 900° C., to a thickness between about 120 to 200 Angstroms.

3. The method of claim 1, wherein said first polysilicon layer is deposited using LPCVD procedures, at a temperature between about 520 to 580° C., to a thickness between about 1000 to 2000 Angstroms, and doped using either in situ doping, deposition procedures, adding either arsine or phosphine to a silane ambient, or said first polysilicon layer can be deposited intrinsically, then doped via ion implantation of either arsenic or phosphorous.

4. The method of claim 1, wherein said capping insulator layer is either a silicon oxide layer, a silicon nitride layer, or a composite layer, with the composite layer comprised of an overlying silicon nitride layer, deposited using either LPCVD or PECVD procedures, to a thickness between about 1500 to 2500 Angstroms, on an underlying silicon oxide layer, deposited using LPCVD or PECVD procedures, to a thickness between about 300 to 600 Angstroms.

5. The method of claim 1, wherein said control gate structure, on said gate oxide layer, and said initial select gate structures, on said gate oxide layer, comprised of said capping insulator layer on said first polysilicon layer, are formed via anisotropic RIE procedures, using $C_4F_8$ as an etchant for said capping insulator layer, and $Cl_2$ as an etchant for said first polysilicon layer.

6. The method of claim 1, wherein said silicon oxide spacers, on the sides of said control gate structure, and on the sides of initial select gate structures, are formed by first depositing a silicon oxide layer, using LPCVD or PECVD procedures, to a thickness between about 300 to 600 Angstroms, and then creating said silicon oxide spacers via an anisotropic RIE procedure, using $CHF_3$ as an etchant.

7. The method of claim 1, wherein said thin tunnel insulator layer is silicon dioxide, thermally grown, in an oxygen-steam ambient, at a temperature between about 850 to 900° C., to a thickness between about 60 to 70 Angstroms.

8. The method of claim 1, wherein said second polysilicon layer is deposited using in situ doped, LPCVD procedures, at a temperature between about 520 to 580° C., to a thickness between about 500 to 1000 Angstroms.

9. The method of claim 1, wherein said floating gate spacer structures are formed via anisotropic RIE of said second polysilicon layer, using $Cl_2$ as an etchant.

10. The method of claim 1, wherein said unwanted floating gate spacer structures are removed using RIE procedures, using $SF_6$ as an etchant.

11. The method of claim 1, wherein said insulator gate spacers, on the sidewalls of said floating gate spacer structure, and on the sidewalls of said final select gate structures are formed by first depositing a silicon oxide layer, via either LPCVD or PECVD procedures, to a thickness between about 500 to 1500 Angstroms, followed by an anisotropic RIE procedure, using $CHF_3$ as an etchant.

12. The method of claim 1, wherein said source and drain node regions, and said bit line regions, in said semiconductor substrate, are formed via ion implantation of either arsenic or phosphorous, at an energy between about 30 to 100 KeV, at a dose between about 1E15 to 1E16 atoms/$cm^2$.

13. A method for fabricating a non-volatile, EEPROM memory cell, on a semiconductor substrate, to provide multiple storage levels, using floating gate spacer structures, comprising the steps of:

forming a P type region in said semiconductor substrate;

growing a gate oxide layer on said semiconductor substrate;

growing a first polysilicon layer on said gate oxide layer;

growing a capping, composite insulator layer on said first polysilicon layer;

anisotropic etching to form a control gate structure, comprised of said capping, composite insulator layer and of said first polysilicon layer, on said gate oxide layer;

anisotropic etching to form initial select gate structures, on said gate oxide layer, comprised of said capping insulator layer and of said first polysilicon layer;

depositing a first silicon oxide layer;

anisotropic etching of said first silicon oxide layer, to form first silicon oxide spacers on the sidewalls of said control gate structure, and on the sidewalls of said initial select gate structures;

growing a thin tunnel insulator layer on regions of said semiconductor substrate not covered by said control gate structure, and not covered by said initial select gate structures;

depositing a second polysilicon layer;

anisotropic etching of said second polysilicon layer, to form said floating gate spacer structures, on said silicon oxide spacers, with said floating gate spacer structures overlying said thin tunnel insulator layer;

removing floating gate spacer structures, from said first silicon oxide spacers, only in a region in which floating gate-spacer structures, on said first silicon oxide spacers, reside on sidewalls of said initial select gate structure, while leaving floating gate structures, on said first silicon oxide spacers, in a region in which floating gate spacer structures, on said first silicon oxide spacers, reside on said control gate structure;

patterning of said initial select gate structures to form final select gate structures;

removing said thin tunnel insulator layer from said semiconductor substrate, in a region of said semiconductor substrate not covered by said floating gate spacer structures, not covered by said control gate structure, and not covered by said final select gate structures;

removing said first silicon oxide spacers from the sidewalls of said final select gate structures;

depositing a second silicon oxide layer;

anisotropic etching of said second silicon oxide layer to form second silicon oxide, gate spacers, on the sidewalls of said floating gate structures, and on the sidewalls of said final select gate structure;

forming N type source and drain regions, in said semiconductor substrate, in regions between said floating gate structures and said final select gate structures; and forming N type bit line regions, in said semiconductor substrate, in regions butting the outside edge of said final select gate structures.

14. The method of claim 13, wherein said gate oxide layer is silicon dioxide, thermally grown in an oxygen-steam ambient, at a temperature between about 850 to 900° C., to a thickness between about 120 to 200 Angstroms.

15. The method of claim 13, wherein said first polysilicon layer is deposited using LPCVD procedures, at a temperature between about 520 to 580° C., to a thickness between about 1000 to 2000 Angstroms, and doped either via in situ doping, deposition procedures, by the addition of either arsine, or phosphine, to a silane ambient, or said first polysilicon layer can be deposited intrinsically, then ion implanting with either arsenic or phosphorous.

16. The method of claim 13, wherein said capping, composite insulator layer, is comprised of a silicon nitride layer, deposited using LPCVD or PECVD procedures, to a thickness between about 1500 to 2500 Angstroms, and an underlying silicon oxide layer, deposited using LPCVD or PECVD procedures, to a thickness between about 300 to 600 Angstroms.

17. The method of claim 13, wherein said control gate structure, and said initial select gate structures, on said gate oxide layer, are formed via anisotropic RIE procedures, using $C_4F_8$ as an etchant for said composite insulator layer, while using $Cl_2$ as an etchant for said first polysilicon layer.

18. The method of claim 13, wherein said first silicon oxide layer is deposited using LPCVD or PECVD procedures, at a temperature between about 300 to 700° C., to a thickness between about 300 to 600 Angstroms.

19. The method of claim 13, wherein said first silicon oxide spacers, on the sides of said control gate structure, and on the sides of said initial select gate structures, are formed via anisotropic RIE procedures, using $CHF_3$ as an etchant.

20. The method of claim 13, wherein said thin tunnel insulator layer is silicon dioxide, thermally grown in an oxygen-steam ambient, at a temperature between about 850 to 900° C., to a thickness between about 60 to 70 Angstroms.

21. The method of claim 13, wherein said second polysilicon layer is deposited using in situ doping, LPCVD procedures, at a temperature between about 520 to 580° C., to a thickness between about 500 to 1000 Angstroms.

22. The method of claim 13, wherein said floating gate spacer structures are formed via anisotropic RIE of said second polysilicon layer, using $Cl_2$ as an etchant.

23. The method of claim 13, wherein said floating gate spacer structures are removed via RIE procedures, using $SF_6$ as an etchant.

24. The method of claim 13, wherein said second silicon oxide layer is deposited using LPCVD or PECVD procedures, at a temperature between about 300 to 700° C., to a thickness between about 500 to 1500 Angstroms.

25. The method of claim 13, wherein said second silicon oxide, gate spacers, are formed via anisotropic RIE of said second silicon oxide layer, using $CHF_3$ as an etchant.

26. The method of claim 13, wherein said N type source and drain node regions, and said N type bit line regions, are formed via ion implantation of arsenic or phosphorous, at an energy between about 30 to 100 KeV, and at a dose between about 1E15 to 1E16 atoms/$cm^2$.

* * * * *